United States Patent
Cai et al.

(10) Patent No.: US 8,445,356 B1
(45) Date of Patent: May 21, 2013

(54) INTEGRATED CIRCUIT HAVING BACK GATING, IMPROVED ISOLATION AND REDUCED WELL RESISTANCE AND METHOD TO FABRICATE SAME

(75) Inventors: Jin Cai, Courtlandt Manor, NY (US); Kangguo Cheng, Albany, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/343,819

(22) Filed: Jan. 5, 2012

(51) Int. Cl.
  *H01L 21/76* (2006.01)
(52) U.S. Cl.
  USPC ........... 438/427; 438/296; 438/424; 257/510; 257/506; 257/374
(58) Field of Classification Search
  USPC .................. 438/427, 424, 296; 257/510, 506, 257/374, 347, E27.091
  See application file for complete search history.

(56) References Cited

U.S. PATENT DOCUMENTS

| | | | |
|---|---|---|---|
| 5,915,192 A * | 6/1999 | Liaw et al. .................... | 438/435 |
| 6,225,664 B1 | 5/2001 | Endo et al. | |
| 6,521,538 B2 * | 2/2003 | Soga et al. ..................... | 438/695 |
| 6,909,149 B2 | 6/2005 | Russ et al. | |
| 7,079,413 B2 | 7/2006 | Tsukamoto et al. | |
| 7,259,428 B2 | 8/2007 | Inaba | |
| 7,666,771 B2 | 2/2010 | Krull et al. | |
| 7,825,488 B2 | 11/2010 | Williams et al. | |
| 7,851,859 B2 | 12/2010 | Tak et al. | |
| 2003/0218494 A1 | 11/2003 | Kubo et al. | |
| 2007/0072388 A1 | 3/2007 | Chen et al. | |
| 2007/0293016 A1 | 12/2007 | Luo et al. | |
| 2008/0116513 A1 | 5/2008 | Williams et al. | |
| 2008/0272439 A1 | 11/2008 | Kapoor et al. | |
| 2010/0038745 A1 | 2/2010 | Wu et al. | |
| 2010/0176482 A1 | 7/2010 | Dennard et al. | |

FOREIGN PATENT DOCUMENTS

JP  2007184549 A  7/2007

* cited by examiner

*Primary Examiner* — Theresa T Doan
(74) *Attorney, Agent, or Firm* — Harrington & Smith

(57) ABSTRACT

Disclosed is a method of forming a structure and a resulting structure. The method includes providing a semiconductor substrate; forming a first opening to a first depth in the semiconductor substrate; amorphizing semiconductor sidewalls of an upper portion of the first opening leaving unamorphized semiconductor sidewalls in a lower portion of the first opening; enlarging only the lower portion of the first opening using an etch process that is selective to the unamorphized semiconductor sidewalls; filling the first opening with an insulator material to form a deep trench isolation (DTI) structure and implanting a first well region and a second well region into the semiconductor substrate. The first well and the second well are separated from one another by the enlarged lower portion of the first opening. In the structure sidewalls of a top portion of a DTI and sidewalls of an STI are formed of doped, recrystallized silicon.

13 Claims, 9 Drawing Sheets

INTEGRATED CIRCUIT HAVING BACK GATING, IMPROVED ISOLATION AND REDUCED WELL RESISTANCE AND METHOD TO FABRICATE SAME

TECHNICAL FIELD

The exemplary embodiments of this invention relate generally to semiconductor devices and fabrication techniques and, more specifically, relate to the fabrication of semiconductor transistor devices, such as those used in random access memory (RAM) and logic circuitry, using a silicon on insulator (SOI) substrate such as an extremely thin SOI (ETSOI) substrate.

BACKGROUND

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX. For a single BOX SOI wafer the thin silicon layer is divided into active regions by shallow trench isolation (STI) which intersects the BOX and provides a total isolation for active device regions formed in the silicon layer. Sources and drains of field effect transistors (FETs) are formed, for example, by ion implantation of N-type and/or P-type dopant material into the thin silicon layer with a channel region between the source and drain using the gate pattern to self-define the channel region. Prior to the formation of sources and drains gates can be formed on top of the channel region, for example, by deposition of a gate dielectric and conductor on the top surface of the thin silicon, followed by photolithographic patterning and etching. Back gates can also be formed under the active region on a single BOX SOI wafer using the BOX layer as the back gate dielectric. The back gates can be defined by, for example, either P or N type implantation to form wells in the underlying Si substrate. In this case P-type wells are separated from N-type wells by the use of deep trench isolation (DTI).

Transistors having back gates can use relatively thin silicon and BOX layers to enable fully depleted device operation with a threshold voltage which is responsive to the back gate. Such FETs built in (extremely) thin SOI technology with back gates can exhibit significant advantages such as, for example, reduced short channel effects, less threshold variability due to body doping fluctuations, and an ability to use the back gate voltage to adjust the threshold voltage (Vt) of the transistor.

SUMMARY

In a first aspect thereof the exemplary embodiments of this invention provide a method of forming a structure. The method comprises providing a semiconductor substrate; forming a first opening to a first depth in the semiconductor substrate; amorphizing semiconductor sidewalls of an upper portion of the first opening leaving unamorphized semiconductor sidewalls in a lower portion of the first opening; enlarging only the lower portion of the first opening using an etch process that is selective to the unamorphized semiconductor sidewalls; filling the first opening with an insulator material to form a deep trench isolation (DTI) structure and implanting a first well region and a second well region into the semiconductor substrate. The first well and the second well are separated from one another by the enlarged lower portion of the first opening.

In another aspect thereof the exemplary embodiments of this invention provide a structure that comprises a silicon substrate; at least two wells in the silicon substrate; and a deep trench isolation (DTI) separating the two wells. The DTI has a top portion and a bottom portion having a width that is larger than a width of the top portion. The structure further includes at least two semiconductor devices disposed over one of the wells, where the at least two semiconductor devices are separated by a shallow trench isolation (STI). In the structure sidewalls of the top portion of the DTI and sidewalls of the STI are comprised of doped, re-crystallized silicon.

BRIEF DESCRIPTION OF THE SEVERAL VIEWS OF THE DRAWINGS

FIG. 1 is an enlarged cross-sectional view of a portion of an ETSOI starting structure;

FIG. 2 shows the structure of FIG. 1 after patterning a pad layer and forming both shallow and deep isolation trenches;

FIG. 3 shows the structure of FIG. 2 after an angled implant is performed into an upper ETSOI portion of the trench sidewalls, thereby amorphizing the Si;

FIG. 4 shows the structure of FIG. 3 after the further etch of the deep isolation trench to form a wider, bottle-shaped region in the Si substrate beneath the BOX layer;

FIG. 5 shows the structure of FIG. 4 after filling the shallow and deep trenches by depositing an insulator, where a void can be formed in the bottle-shaped region;

FIG. 6 shows the structure of FIG. 4 after filling the shallow and deep trenches using an insulator spin-on process;

FIG. 7 shows the structure of either FIG. 5 or FIG. 6 after removal of a pad layer and implanting P and/or N wells in the Si substrate, where the wells are separated by the deep trench isolation structure having the bottle-shaped lower portion; and FIG. 8 shows the structure of FIG. 7 after the formation of field effect transistor (FET) devices over the implanted wells.

FIG. 9 is an enlarged cross-sectional view of a portion of a starting structure that includes a Si bulk substrate and an overlying pad layer;

FIG. 10 shows the structure of FIG. 9 after patterning the pad layer and forming shallow trenches and a deep trench;

FIG. 11 shows the structure of FIG. 10 after an angled implant is performed into the trench sidewalls to form implanted regions in the Si sidewalls;

FIG. 12 shows the structure of FIG. 11 after the further etch of the deep trench to form the wider, bottle-shaped region in the bottom portion of the deep trench;

FIG. 13 shows the structure of FIG. 12 after filling the trenches with an insulator;

FIG. 14 shows the structure of FIG. 13 after the pad layer is removed, the structure is planarized, and a well implant is performed; and FIG. 15 shows the structure of FIG. 14 after the formation of FET devices in and on the Si substrate over the implanted wells.

DETAILED DESCRIPTION

As was noted above, the use of back bias is one attractive approach for further scaling of complementary metal oxide semiconductor (CMOS) devices. One example is found in ETSOI with a thin BOX. The use of different back gate biases can beneficially enable multiple voltage threshold transistors on the same substrate, and enhances power management.

As device dimensions scale the spaces between the wells are also scaled and the overlay tolerance becomes more stringent. Even a slight misalignment of the wells to the deep isolation trenches (DTI) can cause unacceptable junction leakage between the wells. The well resistance is also critical to enabling fast device/chip operation.

The embodiments of this invention provide a method and structure for forming integrated circuits with back gating, improved isolation, and reduced well resistance. The embodiments of this invention provide the use of dual trench isolation with shallow trench isolation (STI) being used for intra-well isolation and deep(er) trench isolation (DTI) being used for inter-well isolation. The DTI has a bottle-shaped profile to improve overlay tolerance.

The structures described herein provide deep trench isolation (DTI) for well-to-well isolation and shallow trench isolation (STI) for isolation within the same well. The lower portion of the DTI is enlarged in width (i.e., thus the DTI can be characterized as having a "bottle-shape") to improve isolation and enhance the process window such as by improving overlay tolerance.

The embodiments of this invention further provide a process for enabling the bottle-shaped trench isolation to be formed with a self-protective layer on an upper sidewall of the trench. The self-protective layer is used when a lower portion of the trench is etched to form the bottle-shaped trench.

The embodiments of this invention are described below in the context of SOI substrates, such as ETSOI substrates, as well as in the context of bulk substrates.

FIGS. 1-8 illustrate a SOI embodiment, such as an ETSOI embodiment of this invention.

Figure 1:
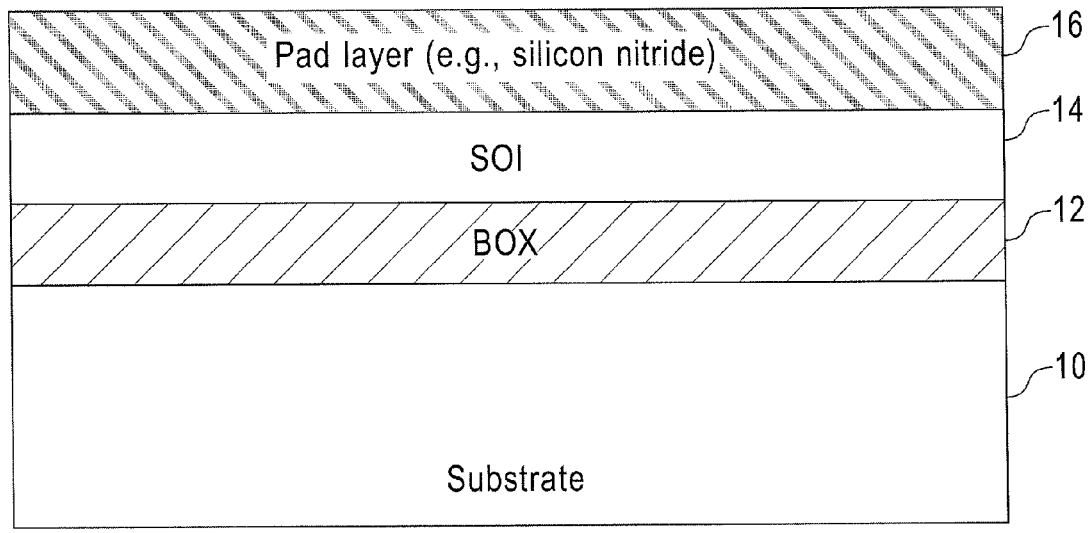
FIGS. 1-8 illustrate a SOI embodiment, such as an ETSOI embodiment of this invention, where.

FIG. 1 is an enlarged cross-sectional view of a portion of an ETSOI starting structure that includes a substrate 10, an overlying insulting layer (a buried oxide or BOX layer 12) and a Si layer overlying the BOX 12. In FIG. 1, and the other FIGURES, the layer thicknesses and feature/structure sizes are not drawn to scale. The Si layer in this embodiment can be an ETSOI layer 14. The BOX 12 can have a thickness in a range of, by example, about 10 nm to about 200 nm. The ETSOI layer 14 can have a thickness in a range of about 5 nm to about 12 nm, with about 6 nm-7 nm being a suitable thickness for many applications of interest. The substrate 10 can be silicon and can have any desired thickness so long as it is thick enough to support the formation of subsequently implanted wells in FIG. 7.

FIG. 1 also shows a pad layer 16 (a pad nitride layer) formed on top of the ETSOI layer 14. The pad layer can have a thickness in a range of, for example, about 5 nm to about 20 nm. A pad oxide layer could also be formed over the pad nitride layer 16.

Figure 2:
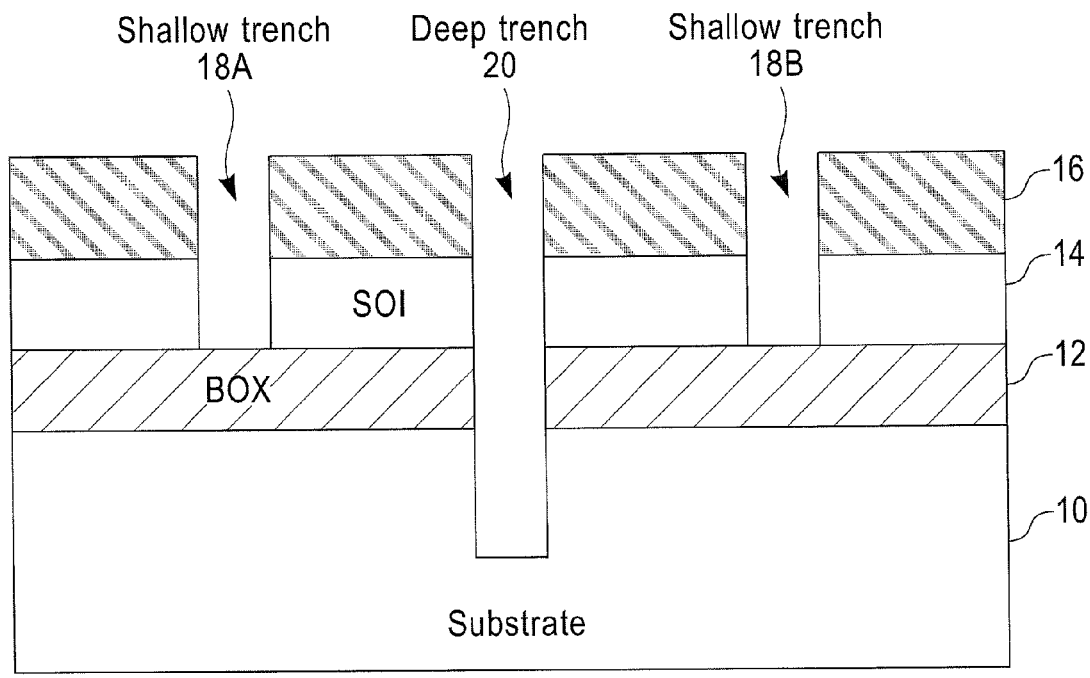

FIG. 2 shows the structure of FIG. 1 after patterning the pad layer 16 and forming using a suitable process, such as a reactive ion etch (REI) process, isolation trenches characterized by shallow trenches 18A, 18B and a deep trench 20. The shallow trenches 18A, 18B extend completely through the ETSOI layer 14 and terminate on the BOX 12. The deep trench 20 extends completely through the ETSOI layer 14, the BOX 12 and into the substrate 10 to a depth that is less than or greater than the depth to which subsequently implanted well regions will be formed. As will be explained in reference to FIG. 7 the subsequently implanted well regions can have a depth in the Si substrate 10 of about, as a non-limiting example, 200 nm.

Figure 3:
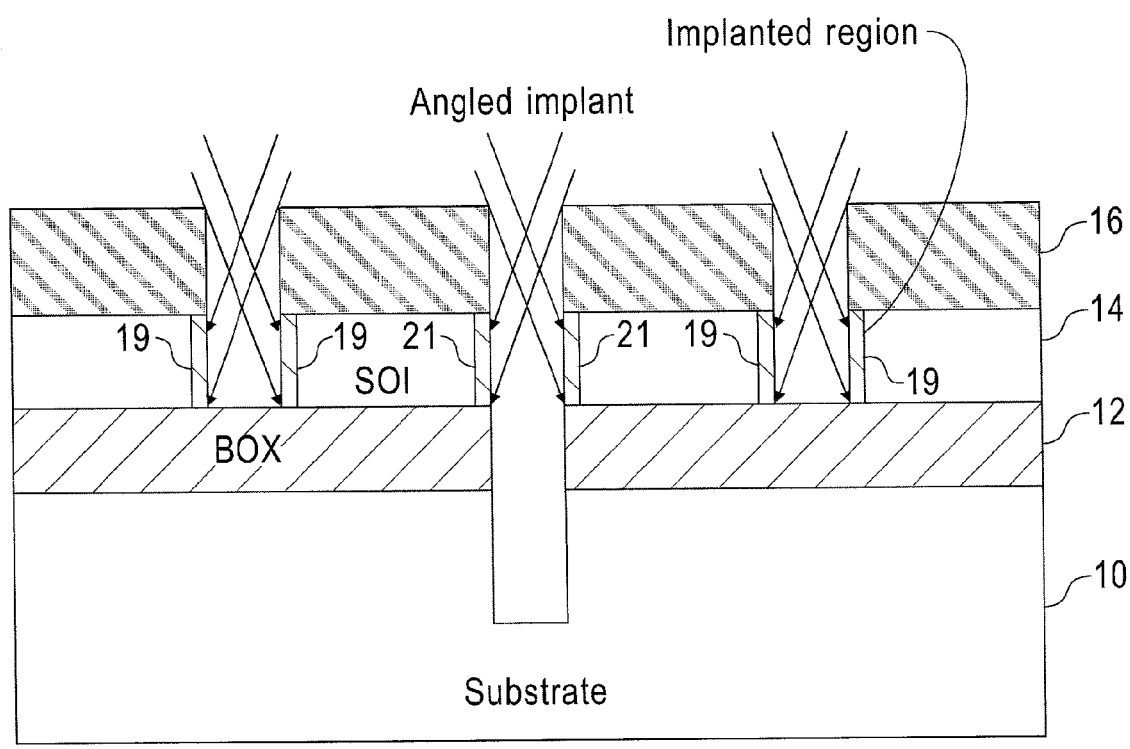

FIG. 3 shows the structure of FIG. 2 after an angled implant is performed into an upper portion of the trench sidewalls to form implanted regions 19 (shallow trenches) and 21 (deep trench) in the ETSOI 14. The implant species can be, for example, Xe, In, $BF_2$, $B_{18}H_{22}$, $C_{16}H_{10}$, Si, Ge or As. As such, the ion implantation energy and dose are directly proportional to the atomic/molecular weight of the implanted species, In one non-limiting example a Xe implant is performed using, for example, 10 KeV implant energy and a $3 \times 10^{14}$ atoms/cm$^2$ dose (a relatively low dose). The angle of the implant is a function of the thickness of the ETSOI layer 14, the widths of the shallow and deep isolation regions and the overlying pad layer 16 and is set so that the trench sidewalls are implanted to a depth equal to or about equal to the thickness of the ETSOI layer 14. The implanted ETSOI sidewall regions 19 and 21, which are substantially amorphized by the implant, function in accordance with an aspect of this invention in a manner analogous to an etch mask in a further deep trench etching process shown in FIG. 4.

Further with regard to FIG. 3, a typical dopant concentration after the ion implantation is mid-$10^{19}$ to mid-$10^{20}$ cm$^{-3}$. For a typical ETSOI thickness of about 6 nm and a STI/DTI width of about 50 nm the implant angle can range from about 40 degrees to about 70 degrees, as non-limiting examples.

Figure 4:
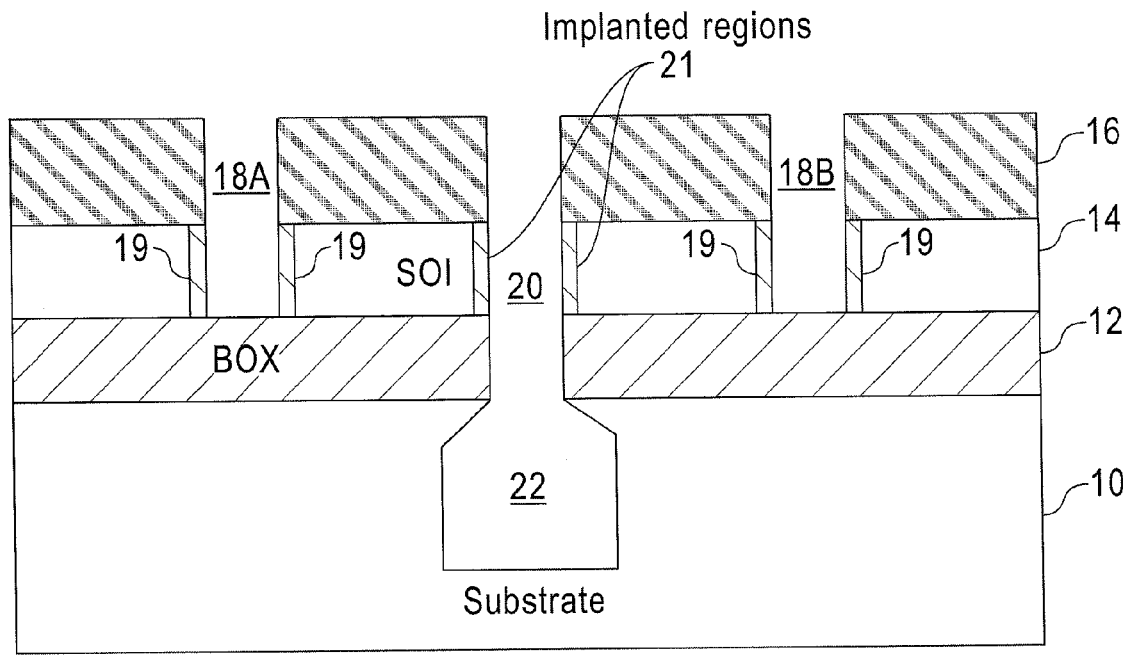

FIG. 4 shows the structure of FIG. 3 after the further etch of the deep trench 20 to form a wider, bottle-shaped region 22. Any reactive ion etch (RIE) process that etches a silicon substrate is suitable for forming the bottle-shaped trench region 22. For example, the process conditions can use a pressure of about 180 mTorr, a flow rate of HBr of about 325 sccm, an $NF_3$ flow rate of about 40 sccm, a high frequency power of about 450 W, an $O_2$ flow rate of about 20 sccm, and a low frequency power of about 1400 W. Hot ammonia can also be used as a selective wet etch. Note that the etch process selectively etches the un-implanted Si (the un-amorphized Si) as compared to the implanted (amorphized) Si in the regions 19 and 21.

Figure 5:
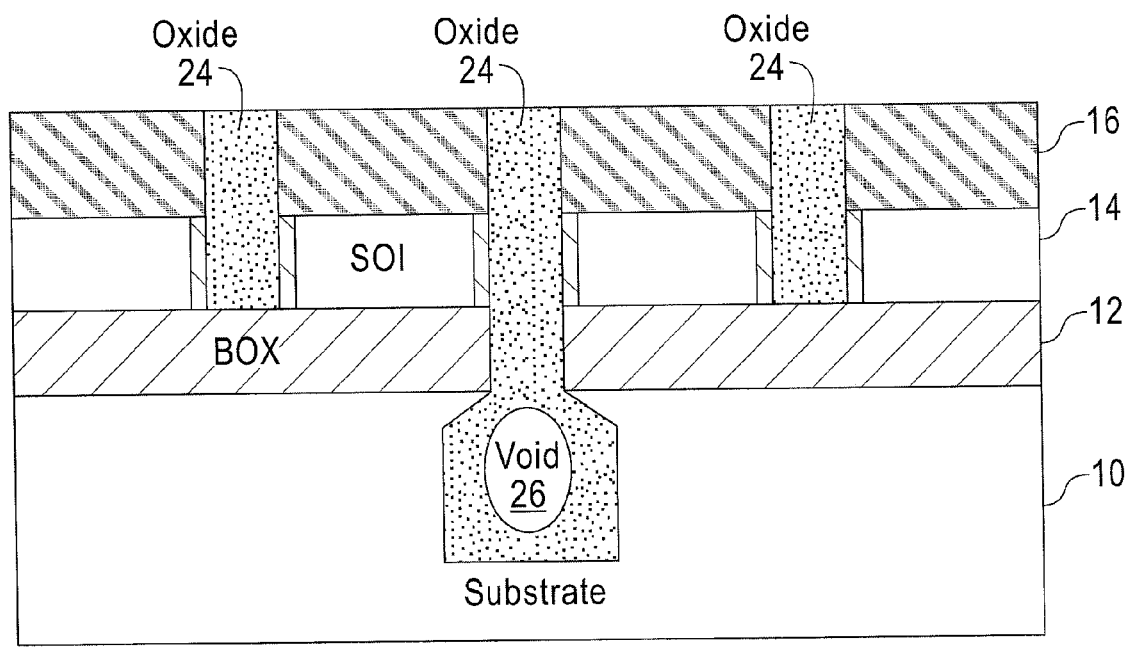

FIG. 5 shows the structure of FIG. 4 after filling the STI trenches 18A, 18B and the DTI trench 20/22 with a deposited insulating material 24 (e.g., with an oxide such as $SiO_2$). Depending on the filling property the oxide may pinch off near the top of the bottle-shaped region 22 of the deep trench leaving a void 26 (a non-zero volume of the bottle-shaped region 22 that does not contain the insulating material 24) in the bottle-shaped region 22. As an example the void 26 can have a volume in a range of about 10% to about 30% of the total DTI volume.

The presence of the void 26 can be beneficial. For example, the presence of the void can inhibit the growth or propagation of a defect through the substrate 10. In addition, the presence of the void 26, which can be considered as forming an air gap, can beneficially enhance the insulating properties of the DTI and the isolation between neighboring wells.

Figure 6:
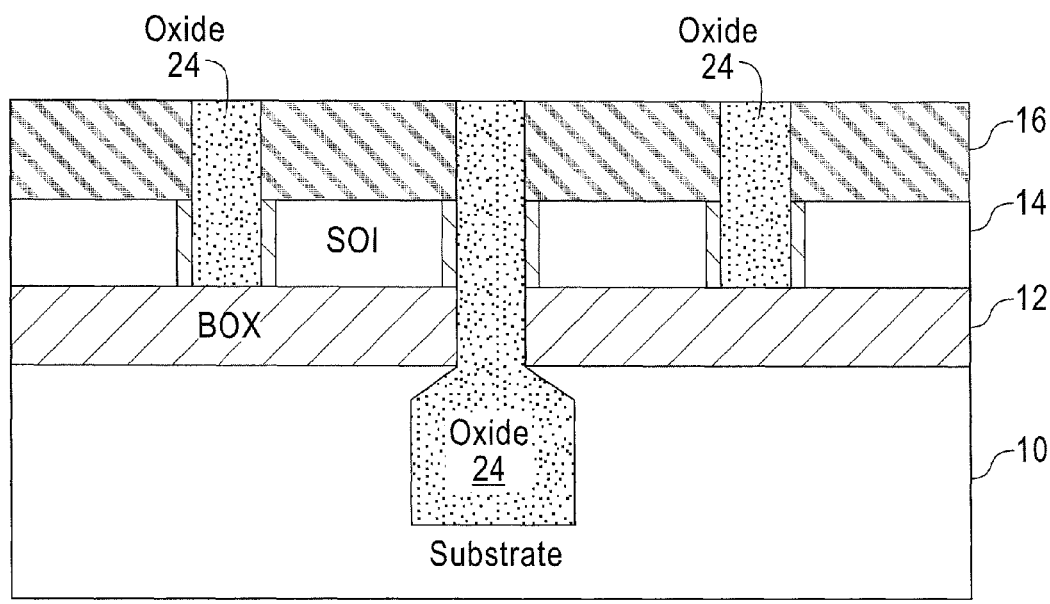

FIG. 6 shows the structure of FIG. 4 after filling the STI trenches 18A, 18B and the DTI trench 20/22 with a spin-on insulator material 24. This embodiment can avoid the formation of the void 26. In practice a flowable oxide (or polymer) is applied to the wafer by spin-coating followed by a thermal anneal to densify the oxide. Spin-on glass (SOG) is one such flowable oxide. SOG typically includes $SiO_2$ suspended in a solvent. Alternatively a two stage oxide deposition process can be performed to deposit an oxide, etch back by RIE, and deposit the oxide again. Note that thermal anneal can function to recrystallize the previously amorphized STI and DTI sidewalls regions 19 and 21 (or by any later-performed anneal process).

In the embodiments shown in FIGS. 5 and 6 there can also be a dielectric liner (for example, one of an oxide (e.g., $SiO_2$), a nitride (e.g. SiN), alumina and a high dielectric constant material) on the walls and bottom of the STI openings 18A, 18B the DTI opening 20/22 prior to deposition of the oxide fill. The dielectric liner, if present, can be conformally deposited prior to blanket deposition of the oxide.

Figure 7:
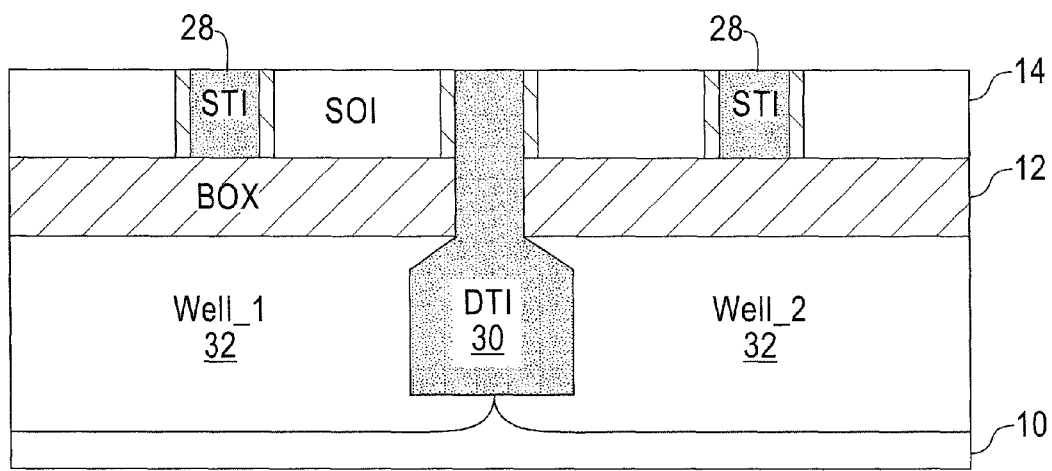

Subsequent to steps of either FIG. 5 or 6, and as is shown in FIG. 7, there exist STI structures 28 and a DTI structure 30.

FIG. 7 shows the structure of either FIG. 5 or FIG. 6 after the pad film layer 16 is conventionally stripped. A planarization step (e.g. a chemical mechanical polish (CMP)) can be performed if needed. The substrate 10 is then implanted to form wells 32 (well_1, well_2) which can be N-type or P-type. The wells 32 will subsequently function as back gates for semiconductor devices to be formed hereafter. The implantation may be a multiple-step process. A combination of low and high implantation energies may be used to achieve N and/or P wells 32 that extend, for example, about 200 nm below the BOX 12 bottom interface to the substrate 10. Depending on the back gate design and biasing conditions the well implant may or may not extend below the DTI bottom interface. The implant specie for the N wells may be, for example, Arsenic or Phosphorus, while the implant specie for the P wells may be, for example, Boron or Boron Fluoride ($BF_2$). The well implant concentration can be on the order of about $10^{18}$ atoms/cm$^3$ (for example). The well implant is followed with an anneal (e.g., 1000° C.) to activate the implanted dopants. It is noted that the previously amorphized STI and DTI sidewalls regions 19 and 21 are recrystallized by the implant activation anneal, if not previously recrystallized by the anneal to densify the spun-on oxide in the embodiment of FIG. 6 (or by any later-performed anneal process).

The DTI 30 provides isolation between the wells (e.g., such as when one well is N-type and the adjacent well is P-type). The presence of the wider, bottle-shaped lower portion of the DTI 30 beneficially relaxes the inter-well overlay precision requirements, thereby improving yield while providing enhanced inter-well isolation and reduced well resistance.

Figure 8:
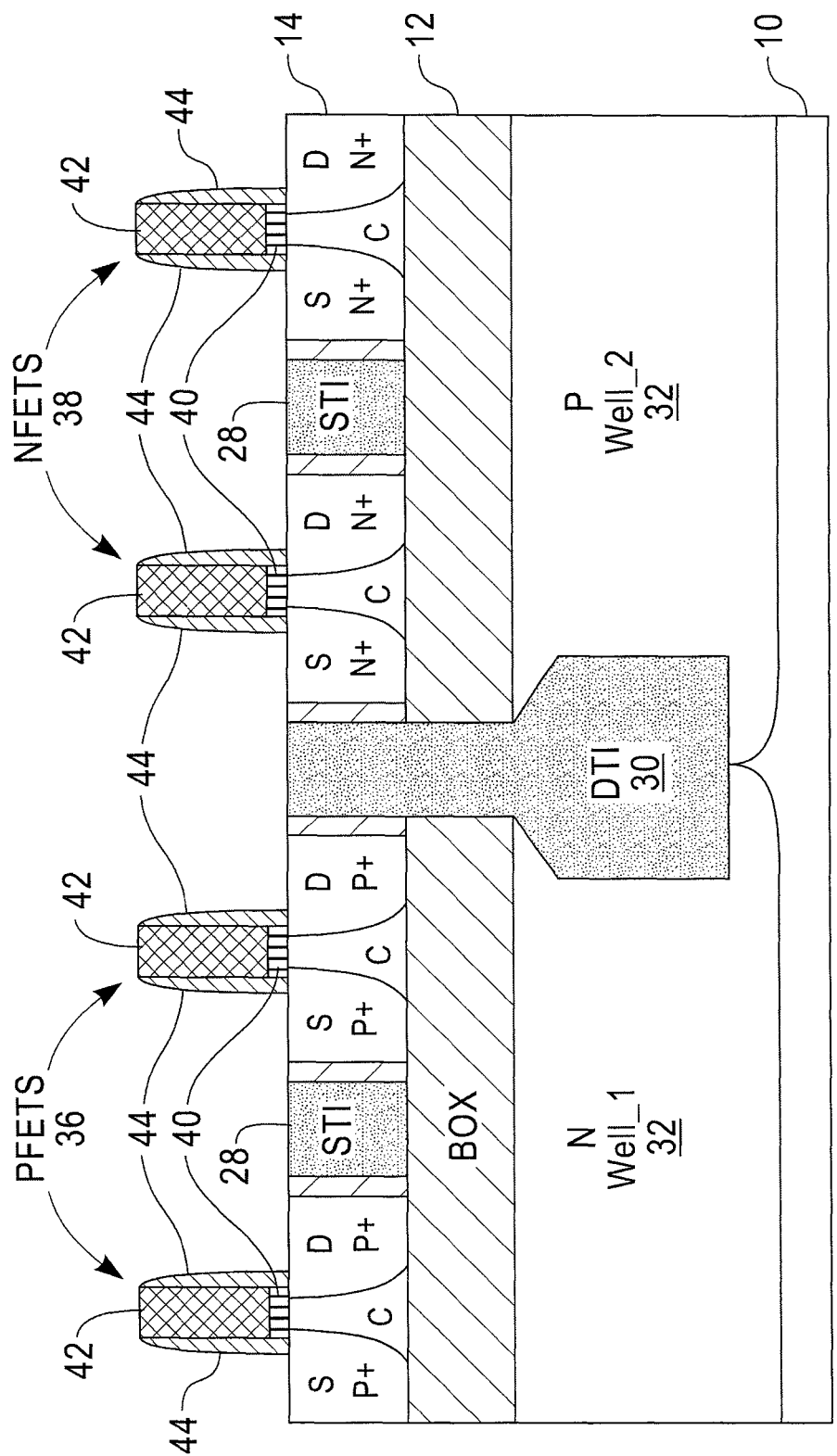

FIG. 8 shows the structure of FIG. 7 after the formation of conventional field effect transistor (FET) devices in and on the ETSOI layer 14. For purposes of illustration and not limitation, the well_1 is assumed to be an N-type well and the well_2 is assumed to be a P-type well. Over the N well_1 are formed PFETs 36 and over P well_2 are formed NFETs 38. It is also within the scope of this invention for there to be NFETs over the N well and PFETs over P well. Separating the PET devices 36 or 38 is the STI 28. In this exemplary embodiment each FET includes a gate structure and implanted or diffused Source (S) and Drain (D) regions, a thin layer of a gate interface layer 40 (e.g., $SiO_2$) that underlies a gate conductor 42, and a gate spacer 44 (e.g., silicon nitride). A FET Channel (C) is located between the S/D regions.

The gate conductor 42 can be a metal or metal system. As non-limiting examples the gate conductor 42 can include a metal system selected from one or more of TiN, TiC, TaN, TaC, TaSiN, HfN, W, Al and Ru, and can be selected at least in part based on the desired work function (WF) of the device (NFET or PFET), as is known. In other embodiments the gate conductor 42 can be doped polysilicon.

The gate structure can also include a thin layer of gate dielectric (not shown) formed as a layer of oxide or nitride or from a high dielectric constant (high-k) material comprising a dielectric metal oxide and having a dielectric constant that is greater than the dielectric constant of silicon nitride of 7.5. The high-k dielectric layer may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer may be from 1 nm to 10 nm, and more preferably from about 1.5 nm to about 3 nm. The high-k dielectric layer can have an effective oxide thickness (EOT) on the order of, or less than, about 1 nm. The gate conductor 42 can be deposited directly on the surface of the high-k dielectric layer by, for example, chemical vapor deposition (CVD), physical vapor deposition (PVD), or atomic layer deposition (ALD).

In the PFETs 36 the S/D can be doped P+ (e.g., using implanted or diffused Boron) while in the NFETs 38 the S/D can be doped N+ (e.g., using implanted or diffused Arsenic). The S/D regions can have an implant species concentration on the order of about, as a non-limiting example, $10^{19}$-$10^{21}$ atoms/cm$^3$.

In other exemplary embodiments of this invention the PFETs 36 and NFETs 38 can have raised source/drain (RSD) structures.

An interlevel dielectric layer (not shown) can subsequently be applied over the PFETs 36 and NFETs 38. Well contacts (not shown) can be formed, such as a well contact to contact N well_1 and a well contact to contact P well_2. The well contacts enable the same or different back bias to be applied to the wells 32. The well contacts can be formed by masking the FET devices 36, 38, etching through the interlevel dielectric, the STI 28 and the BOX layer 12 and then filling with a contact metal such as tungsten.

FIGS. 9-15 illustrate a bulk Si substrate embodiment of this invention. Layers and structures as in FIGS. 1-8 are numbered accordingly. As in FIGS. 1-8, the layer thicknesses and feature/structure sizes are not drawn to scale.

Figure 9:
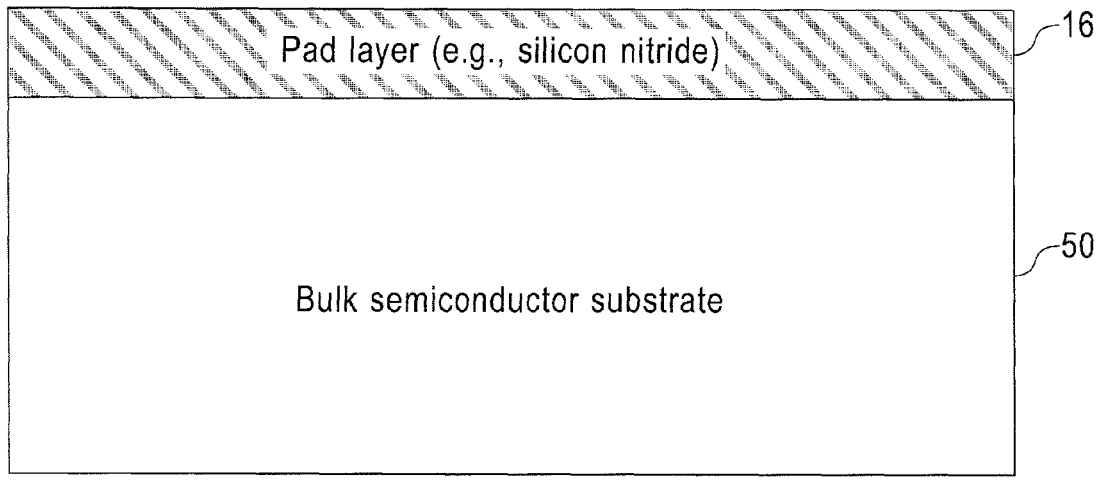
FIGS. 9-15 illustrate a bulk Si substrate embodiment of this invention, where layers and structures as in FIGS. 1-8 are numbered accordingly, and where.

FIG. 9 is an enlarged cross-sectional view of a portion of a starting structure that includes a Si bulk substrate 50 having the pad layer 16 (a pad nitride layer) formed on the top surface of the substrate 50. A pad oxide layer could also be formed over the pad nitride layer 16.

Figure 10:
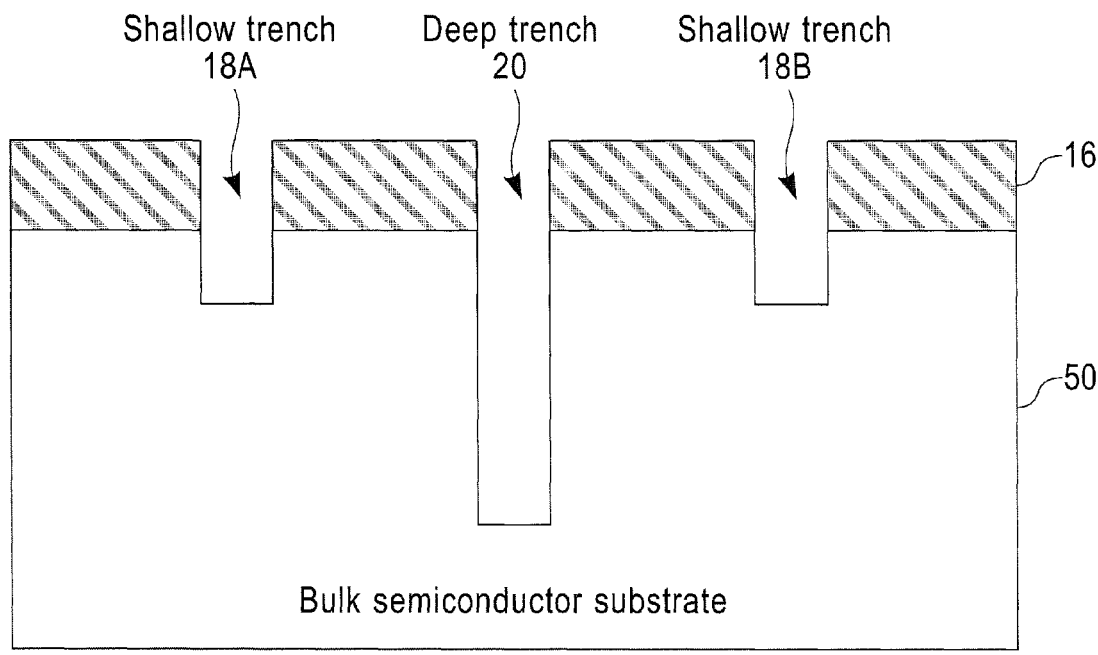

FIG. 10 shows the structure of FIG. 9 after patterning the pad layer 16 and forming using a suitable process, such as a reactive ion etch (REI) process, isolation trenches characterized by the shallow trenches 18A, 18B and the deep trench 20. The deep trench 20 extends into the substrate 50 to a depth (e.g., about 200 nm) that is less than or greater than the depth to which the subsequently implanted well regions will be formed. The shallow trenches 18A, 18B have a depth that exceeds a depth to which FET source and drains with be formed to provide isolation between adjacent FETs. The shallow trenches 18A, 18B can have a depth of, for example, about 10 nm to about 50 nm.

Figure 11:
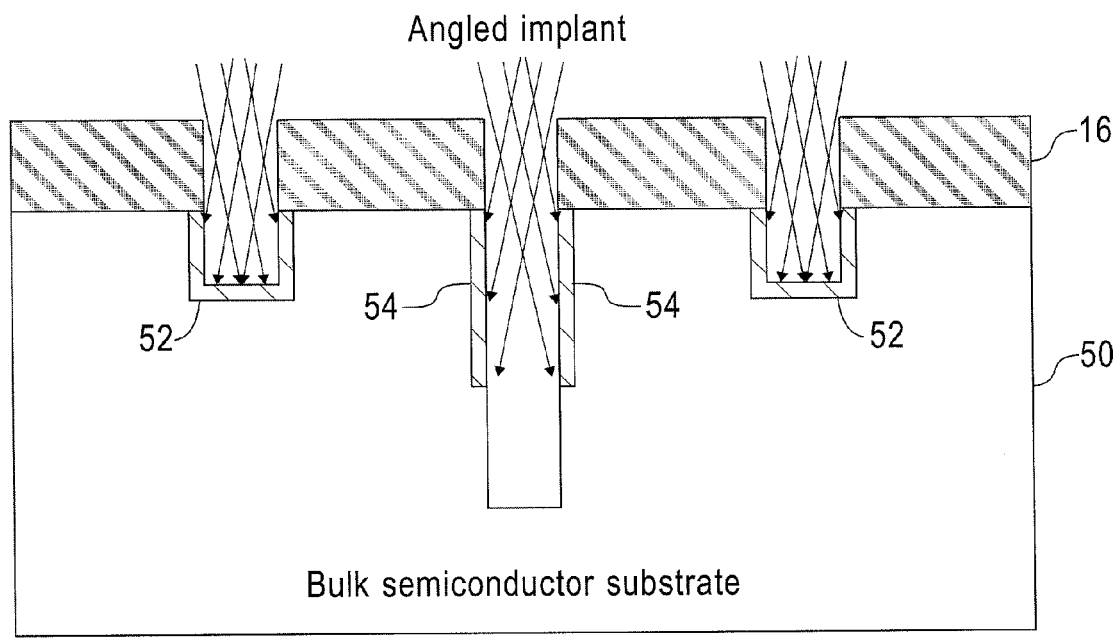

FIG. 11 shows the structure of FIG. 10 after an angled implant is performed into the trench sidewalls to form implanted regions 52 (shallow trenches) and 54 (deep trench) in the Si substrate 50. The implant species can be, for example, Xe, Ge or As. In one non-limiting example a Xe implant is performed using, for example, 10 KeV implant energy and a $3\times10^{14}$ atoms/cm$^2$ dose (a relatively low dose). Note that implant differs from the implant made in FIG. 3 in that the implanted regions 52 cover the sidewalls and the bottom surface of the shallow trenches 18A and 18B. In addition, the implanted region 54 in the deep trench 20 extends deeper into the Si substrate 54 than the bottom surfaces of the shallow trenches 18A, 18B. As in the embodiment of FIGS. 1-8 the implanted regions 52 and 54, which are substantially amorphized by the implant, function in accordance with an aspect of this invention in a manner analogous to an etch mask in a further deep trench etching process shown in FIG. 12.

Figure 12:
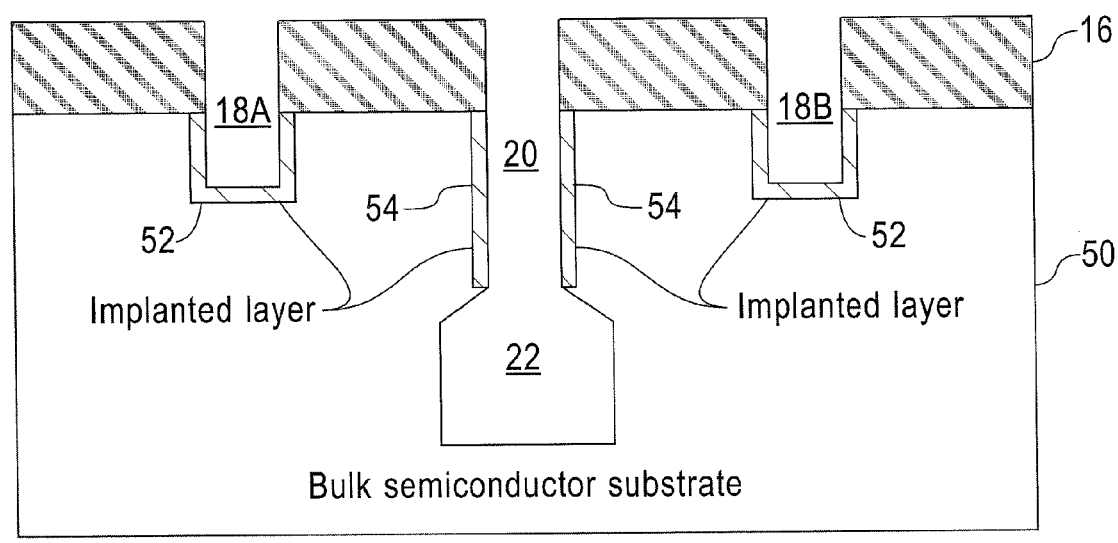

FIG. 12 shows the structure of FIG. 11 after the further etch of the deep trench 20 to form the wider, bottle-shaped region 22. As in the embodiment of FIGS. 1-8, any reactive ion etch (RIE) process that etches a silicon substrate is suitable for forming the bottle-shaped trench region 22. For example, the process conditions can use a pressure of about 180 mTorr, a flow rate of HBr of about 325 sccm, an $NF_3$ flow rate of about 40 sccm, a high frequency power of about 450 W, an $O_2$ flow rate of about 20 sccm, and a low frequency power of about 1400 W. Hot ammonia can also be used for the selective etch. This etch process selectively etches the un-implanted Si as compared to the implanted (amorphized) Si in the regions 52 and 54.

Figure 13:
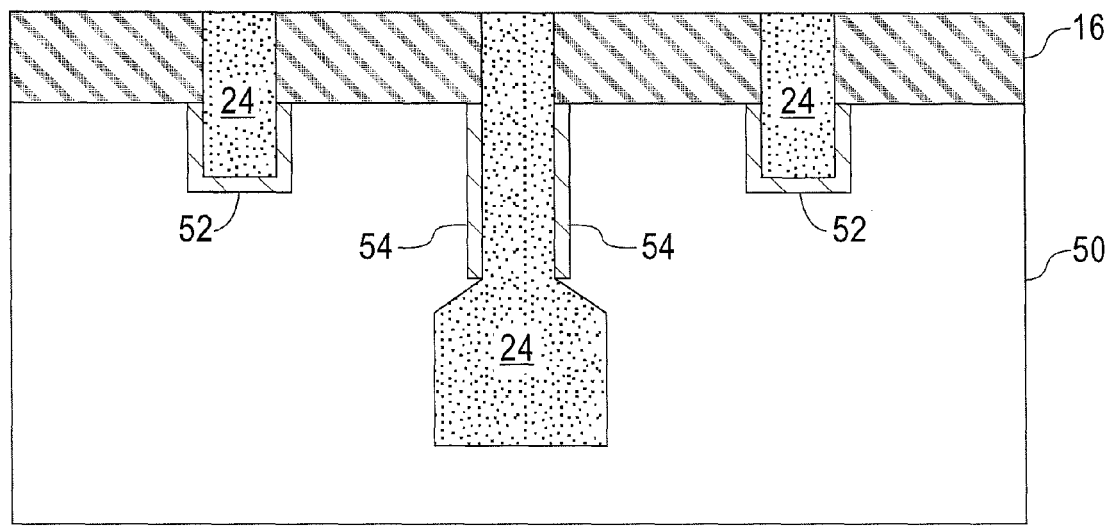

FIG. 13 shows the structure of FIG. 12 after filling the STI trenches 18A, 18B and the DTI trench 20/22 with an insulator, such as a spin-on insulator material 24 (oxide). In an alternate embodiment an oxide deposition process can be used as in FIG. 5 which can result in the formation of the void 26. A flowable oxide (or polymer) is applied and spun-on followed by a thermal anneal to densify the oxide. Note that the thermal anneal can function to recrystallize the previously amorphized STI and DTI sidewalls regions 52 and 54 (or these regions can be recrystallized by any later-performed anneal process).

In the embodiment shown in FIG. 13 there can also be a dielectric liner (for example, silicon nitride) on the walls and bottom of the STI openings 18A, 18B the DTI opening 20/22 prior to deposition of oxide fill. The dielectric liner, if present, can be conformally deposited prior to blanket deposition of the oxide.

Figure 14:
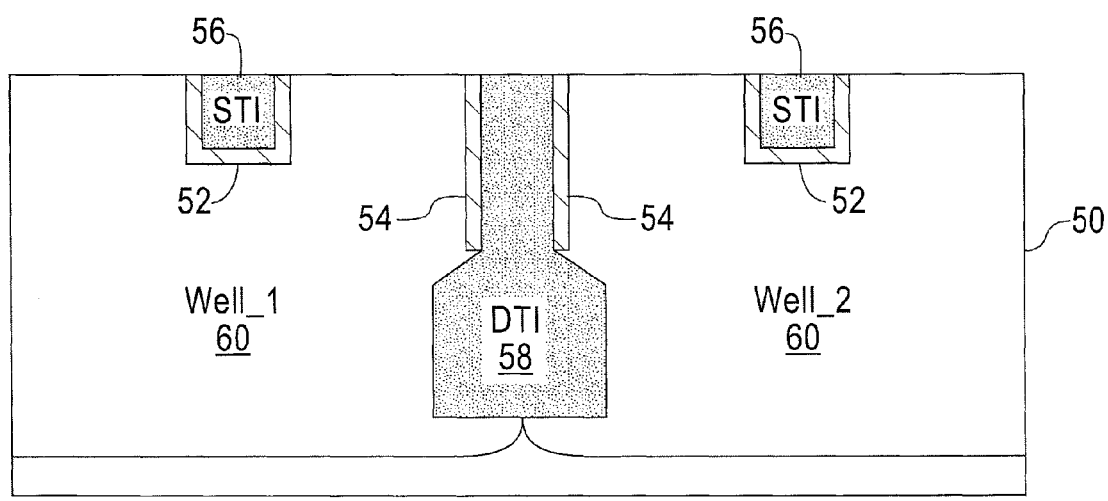

Subsequent to the processing of FIG. 13, and as is shown in FIG. 14, there exist STI structures 56 and a DTI structure 58 in the Si substrate 50.

FIG. 14 shows the structure of FIG. 13 after the pad film layer 16 is conventionally stripped. A planarization step (e.g. a chemical mechanical polish (CMP)) can be performed if needed. The substrate 50 is then implanted to form the wells 60 (well_1, well_2) which can be N-type or P-type. As in the embodiment described above with reference to FIGS. 1-8 the wells 60 will subsequently function as back gates for the subsequently formed semiconductor devices. The implantation may be a multiple-step process. A combination of low and high implantation energies may be used to achieve N and/or P wells 60 that extend, for example, about 200 nm below the top surface of the Si substrate 50. Depending on the back gate design and bias conditions on the back gates the well implant may or may not extend beyond the bottom interface of DTI 58. The implant specie for the N wells may be, for example, Arsenic or Phosphorus, while the implant specie for the P wells may be, for example, Boron or Boron Fluoride ($BF_2$). The well implant concentration can be on the order of about $10^{18}$ atoms/$cm^3$ (for example). The well implant is followed with an anneal (e.g., 1000° C.) to activate the implanted dopants. It is again noted that the previously amorphized STI and DTI regions 52 and 54 are recrystallized by the implant activation anneal, if not previously recrystallized by the anneal to densify the spun-on oxide in the embodiment of FIG. 13 (or by any later-performed anneal process).

Figure 15:
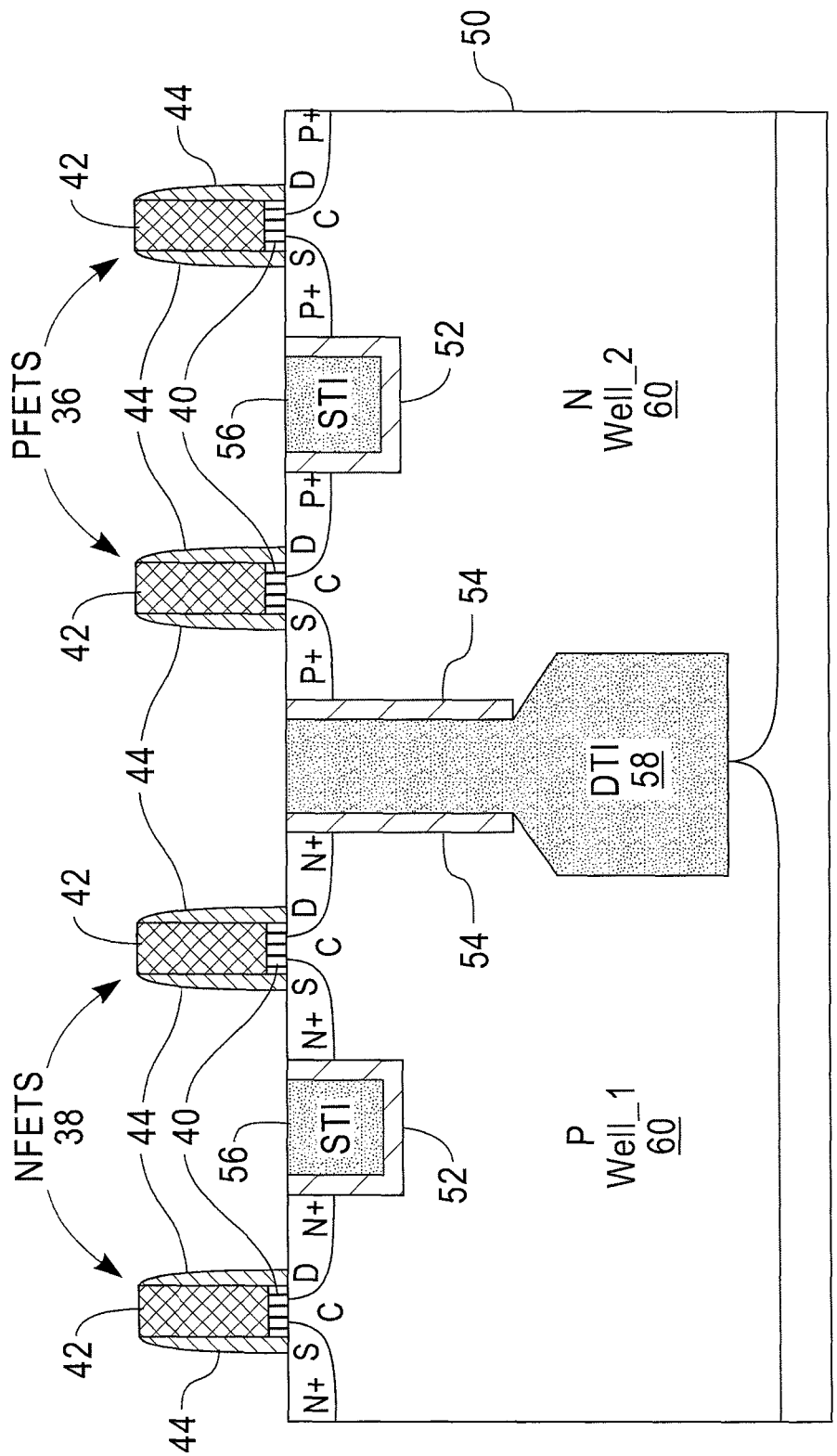

The DTI 58 provides isolation between the wells 60 (e.g., such as when one well is N-type and the adjacent well is P-type as shown in FIG. 15). The presence of the wider, bottle-shaped lower portion of the DTI 58 beneficially relaxes the inter-well overlay precision requirements, thereby improving yield while providing enhanced inter-well isolation and reduced well resistance.

FIG. 15 shows the structure of FIG. 14 after the formation of conventional field effect transistor (FET) devices in and on the Si substrate 50. For purposes of illustration and not limitation, in this embodiment the well_1 is assumed to be a P-type well and the well_2 is assumed to be an N-type well. Over the N well_1 are formed PFETs 36 and over P well_2 are formed NFETs 38. It is also within the scope of this invention for there to be NFETs over the N well and PFETs over P well. Separating the FET devices 36 or 38 is the STI 56. In this exemplary embodiment each FET includes the gate structure and implanted or diffused Source (S) and Drain (D) regions, the thin layer of a gate interface layer 40 (e.g., $SiO_2$) that underlies the gate conductor 42, and the gate spacer 44 (e.g., silicon nitride). The FET Channel (C) is located between the S/D regions. The gate metals and gate dielectrics can be the same as was described above in reference to FIG. 8. Also, in the PFETs 36 the S/D can be doped P+ (e.g., using implanted or diffused Boron) while in the NFETs 38 the S/D can be doped N+ (e.g., using implanted or diffused Arsenic). The S/D regions can have an implant species concentration on the order of about, as a non-limiting example, $10^{19}$-$10^{21}$ atoms/$cm^3$.

In other exemplary embodiments of this invention the PFETs 36 and NFETs 38 can have raised source/drain (RSD) structures.

The interlevel dielectric layer (not shown) can subsequently be applied over the PFETs 36 and NFETs 38 and the well contacts (not shown) can be formed, such as a well contact to contact P well_1 and a well contact to contact N well_2. The well contacts enable the same or different back gate bias to be applied to the wells 60. The well contacts can be formed by masking the FET devices 36, 38, etching through the interlevel dielectric and the STI 562 and then filling with a contact metal such as tungsten.

It is noted that the well resistance between two adjacent ones of the DTI depends at least in part on: (1) the depth below the BOX 12 and (2) the distance between the two DTIs. The greater the depth the lower is the well resistance. Also the smaller the distance between the two DTI the lower is the well resistance. Due to the bottle shape of the DTI the intra-well length is reduced and hence the well resistance is reduced accordingly. In the SOI layer 14 the DTI separation is larger than under the BOX.

It is to be understood that although the exemplary embodiments discussed above with reference to FIGS. 1-15 can be used be used when fabricating a variety of PET devices including, e.g., PET devices with multi-fingered FIN and/or gate structures, PET devices of varying gate width and length, as well as ring oscillator devices.

An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, ion implant processes and etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A method of forming a structure, comprising:
    providing a semiconductor substrate;
    forming a first opening to a first depth in the semiconductor substrate;
    amorphizing semiconductor sidewalls of an upper portion of the first opening leaving unamorphized semiconductor sidewalls in a lower portion of the first opening;
    enlarging only the lower portion of the first opening using an etch process that is selective to the unamorphized semiconductor sidewalls;
    filling the first opening with an insulator material to form a deep trench isolation (DTI) structure; and
    implanting a first well region and a second well region into the semiconductor substrate, the first well and the second well being separated from one another by the enlarged lower portion of the first opening.

2. The method of claim 1, where the first depth is about equal to a depth in the semiconductor substrate to which the first well region and the second well region are implanted.

3. The method of claim 1, further comprising:
    forming a second opening to a second depth in the semiconductor substrate, the second depth being less than the first depth; and
    totally amorphizing semiconductor sidewalls of the second opening; where
    filling the first opening with an insulator material also fills the second opening to form a shallow trench isolation (STI) structure.

4. The method of claim 3, where the semiconductor substrate is disposed beneath a buried oxide layer that in turn is disposed beneath a semiconductor layer, where the first opening extends through the semiconductor layer, through the buried oxide layer and into the semiconductor substrate, and where the second opening extends through the semiconductor layer to the buried oxide layer, and where the amorphized upper portion of the first opening is disposed within the semiconductor layer.

5. The method of claim 3, where the semiconductor substrate is a bulk semiconductor substrate, where totally amorphizing semiconductor sidewalls of the second opening also amorphizes a bottom surface of the second opening.

6. The method of claim 5, where the amorphized first portion of the first opening extends to a greater depth in the bulk semiconductor substrate than the amorphized sidewalls and bottom surface of the second opening.

7. The method of claim 3, where amorphizing the semiconductor sidewalls of the upper portion of the first opening and totally amorphizing the semiconductor sidewalls of the second opening is accomplished using an angled ion implant.

8. The method of claim 7, where the angled ion implant uses one of Xe, In, $BF_2$, $B_{18}H_{22}$, $C_{16}H_{10}$, Si, Ge or As as an implant species.

9. The method of claim 7, where the angled ion implant uses Xe as an implant species and is performed with about a 10 KeV implant energy and about a $3 \times 10^{14}$ atoms/cm$^2$ dose.

10. The method of claim 3, further comprising re-crystallizing the amorphized semiconductor sidewalls of the first and the second openings.

11. The method of claim 10, where re-crystallizing is accomplished during at least one of an anneal process conducted to densify the insulator material and a dopant activation anneal process conducted after implanting the first and second wells.

12. The method of claim 3, further comprising forming semiconductor devices over the first and second wells, where the first and second wells function as back gates for the semiconductor devices, and where two adjacent semiconductor devices are separated from one another by the STI.

13. The method of claim 1, where filling the first opening with an insulator material to form the DTI structure forms a void within the insulator material that fills the lower portion of the first trench.

* * * * *